March 6, 1951 D. E. MAXWELL 2,544,340

VOLUME CONTROLLING AMPLIFIER

Filed May 23, 1946 2 Sheets-Sheet 1

Inventor:
Donald E. Maxwell,
by Merton D Morse
His Attorney.

March 6, 1951 D. E. MAXWELL 2,544,340

VOLUME CONTROLLING AMPLIFIER

Filed May 23, 1946 2 Sheets-Sheet 2

Inventor:
Donald E. Maxwell,
by Merton D Moore
His Attorney.

Patented Mar. 6, 1951 2,544,340

UNITED STATES PATENT OFFICE 2,544,340

VOLUME CONTROLLING AMPLIFIER

Donald E. Maxwell, New Canaan, Conn., assignor to General Electric Company, a corporation of New York Application May 23, 1946, Serial No. 671,678

14 Claims. (Cl. 179—171)

This invention relates to amplifiers of the type wherein the gain or amplification may be varied at will or by automatic means.

It is an object of this invention to provide an improved amplifier having controllable gain.

It is another object of this invention to provide an improved amplifier of the type wherein gain is varied in accordance with the magnitude of output signals.

It is a further object of this invention to provide an improved amplifier of the type having reduced amplification when the output signals exceed a predetermined maximum value.

Another object of this invention is to provide an improved amplifier having controllable gain, the range of gain control being sufficient to permit reduction of gain to zero.

Yet another object of this invention is to provide an improved amplifier adaptable to automatic gain control by simple methods employing electron discharge devices and permitting large variations in gain with low inherent signal distortion.

Still another object of this invention is to provide a circuit whereby voltage may be built up with any desired degree of rapidity after application of a control voltage and voltage is reduced at a predetermined rate after the control voltage disappears.

Further it is an object of this invention to provide an amplifier having automatic gain control in accordance with the magnitude of output signals and which responds with great rapidity to sudden changes in input signals but slowly restores gain at a predetermined rate after normal signals are restored.

Figure 1:
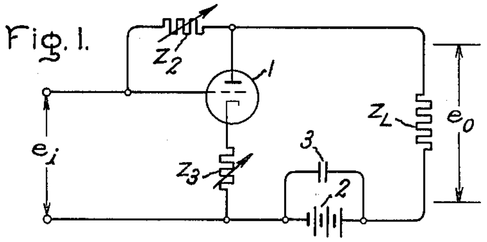
Figure 2:
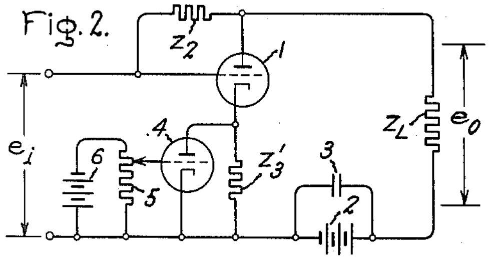
Figure 3:
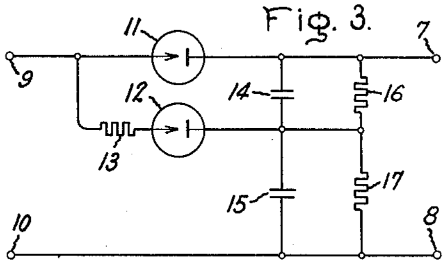
Figure 4:
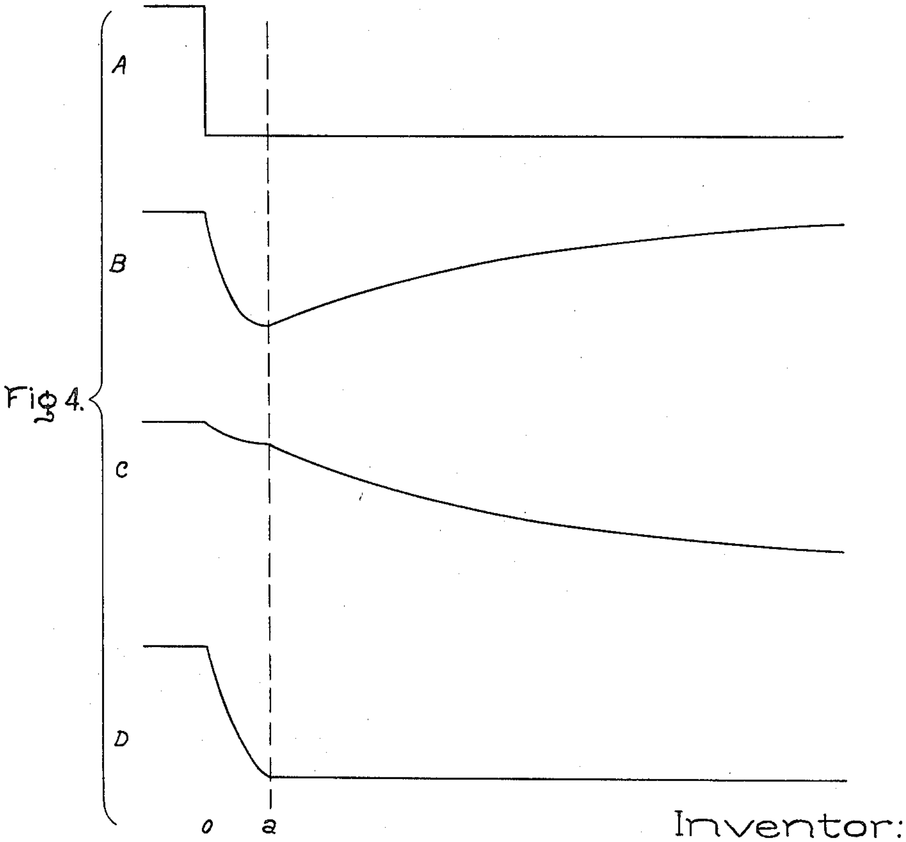
Figure 6:
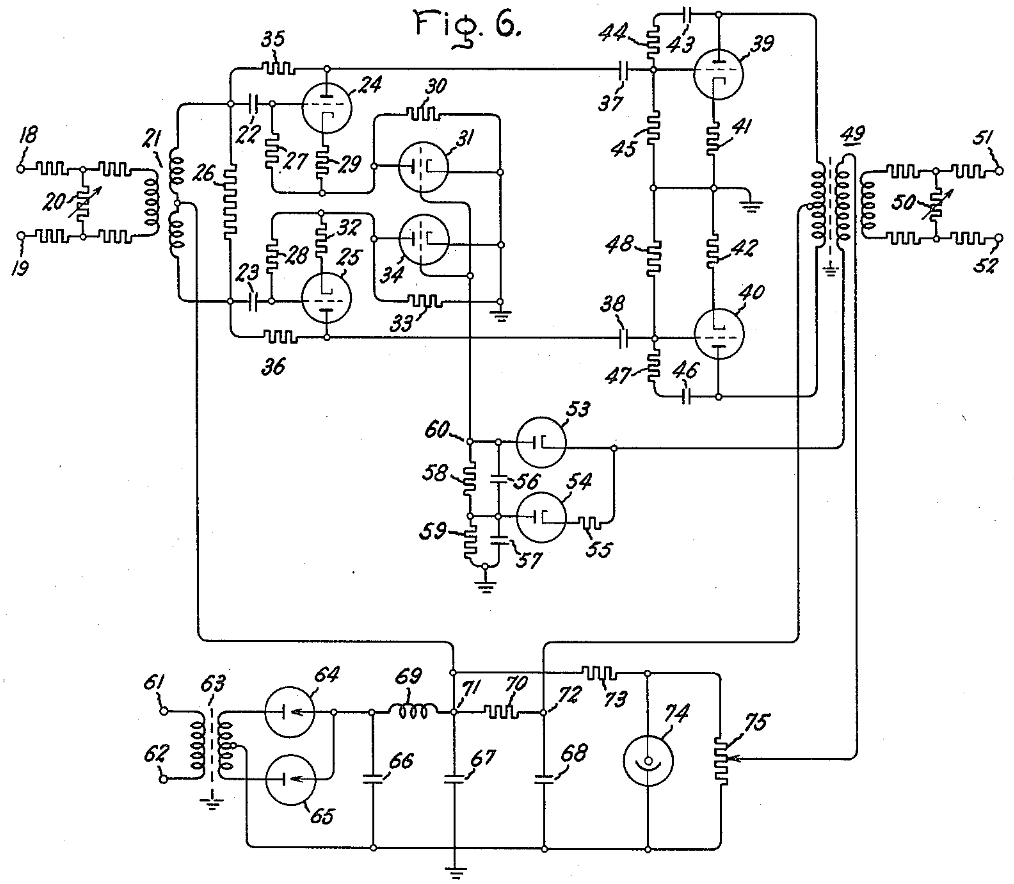
Figure 5:
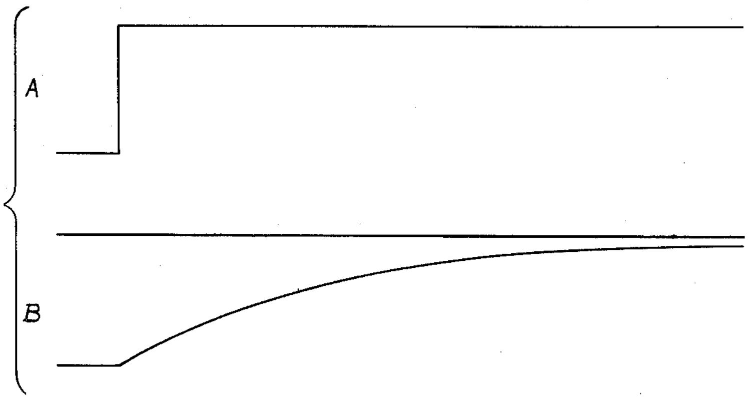

The novel features which I believe to be characteristic of my invention are set forth with particularity in the appended claims. My invention itself, however, both as to its organization and method of operation, together with further objects and advantages thereof may best be understood by reference to the following description taken in connection with the accompanying drawings in which: Fig. 1 shows the basic circuit diagram of the gain control amplifier; Fig. 2 shows the amplifier adapted for automatic gain control; Fig. 3 shows my improved fast-charging slow-discharging circuit; Fig. 4 shows in detail the action of the circuit shown in Fig. 3 when charging; Fig. 5 shows the action of the circuit shown in Fig. 3 when discharging; and Fig. 6 shows a complete peak level governing amplifier embodying the principles of my invention.

Referring now to Fig. 1 which shows the basic circuit diagram of the gain control circuit, 1 represents an electron discharge device, shown for purposes of illustration as a triode. Input signals are applied between the control electrode and cathode of device 1 through common cathode impedance $Z_3$. Impedance $Z_2$ connects the control electrode of device 1 to the anode. Load impedance $Z_L$ is connected in the conventional manner to the anode of device 1 and to the positive terminal of unidirectional voltage source 2. Condenser 3 is provided to bypass signal currents around source 2.

In the circuit of Fig. 1 a certain amount of output voltage is obtained from current flow through impedance $Z_2$. In addition, degenerative feedback results from the presence of unbypassed impedance $Z_3$ between the cathode of device 1 and the input terminal. It can be shown that the ratio of output voltage, $e_o$, to input voltage, $e_i$, is given by the following equation:

$$(1)\qquad \frac{e_o}{e_i}=\frac{uZ_2-[r_p+(1+u)Z_3]}{[r_p+(1+u)Z_3]\left[1+\frac{Z_2}{Z_L}\right]+Z_2}$$

where the symbols represent the complex impedance values of the circuit components shown in Fig. 1, and $r_p$ and $u$ are the internal anode resistance and amplification factor of device 1 respectively.

For the particular case when impedance $Z_3$ is zero, the ratio of $e_o$ to $e_i$ is:

$$(2)\qquad \frac{e_o}{e_i}=\frac{uZ_2-r_p}{r_p\left[1+\frac{Z_2}{Z_L}\right]+Z_2}$$

From Equation 1 it is evident that the voltage gain of the amplifier shown in Fig. 1 is zero when:

$$(3)\qquad uZ_2=r_p+(1+u)Z_3$$

This follows from the fact that the numerator of Equation 1 is zero when the above conditions exist. Hence, gain may be controlled by varying the value of either $Z_2$ or $Z_3$ as indicated schematically by the arrows, thereby satisfying Equation 3 to a greater or lesser degree.

In general, the impedance values of Equation 3 will be resistive. However, this condition is not essential to satisfy the required relations and in some circumstances it is advantageous to use inductive and condensive impedances. In particular, by proper choice of circuit constants, Equation 3 can be satisfied at a particular frequency only, thereby providing a frequency selective action. Hence, this circuit not only provides gain control but also frequency selective gain control.

In general, I prefer to vary $Z_3$ from the value satisfying Equation 3 to a very low value to control amplifier gain because the control achieved amounts to altering the magnitude of negative feedback from a large value at no gain to nearly zero at maximum gain. It is well known that the effect of increasing negative feedback in a circuit is to reduce the distortion introduced by that circuit by an amount determined by the degree of feedback. Hence, decreasing the gain of the circuit of Fig. 1 by causing impedance $Z_3$ to increase, provides a compensating improvement in fidelity that prevents distortion that might otherwise be associated with operation of the circuit at low gain.

In Fig. 2, an embodiment of the circuit for control of amplifier gain by means of a control voltage is shown. In this circuit, electron discharge device 1 is connected just as in the case of Fig. 1 except that electron discharge device 4 is connected in shunt with impedance $Z_3'$. In addition, unidirectional voltage source 6 and potentiometer 5 are provided to adjust the control electrode voltage of device 4, thereby to alter the effective internal anode resistance of that device. It is evident from Fig. 2 that varying the control electrode voltage of device 4 alters the effective value of impedance $Z_3$ in the equivalent circuit shown in Fig. 1. If, for instance, impedance $Z_3'$ is made of such a value that the amplifier of Fig. 2 has no gain when space current in device 4 is cut-off, decreasing the control electrode voltage of that tube will reduce the effective impedance $Z_3$ and increase the gain of the circuit. If the effective internal anode resistance of device 4 is very low, the gain of this amplifier will approach the value given by Equation 2 for the case of $Z_3$ equal to zero.

Of course, the control electrode voltage of device 4 may correspond to any desired control, as for example amplifier output voltage. If, for example, it is desired to limit output voltage, $e_o$, to a predetermined value, device 4 may be changed from a relatively conducting condition to cut-off when this voltage is reached, thus preventing amplification of signals above the predetermined value. A system of this type is described in further detail with reference to Fig. 6.

Fig. 3 shows a circuit constructed in accordance with another aspect of this invention. The purpose of this circuit is rapidly to increase the voltage across terminals 7 and 8 when a predetermined voltage is applied across terminals 9 and 10 and slowly to decrease voltage across terminals 7 and 8 when the voltage across terminals 9 and 10 disappears. In the figure two rectifiers, 11 and 12 are provided, rectifier 11 being arranged to charge condensers 14 and 15 in series and rectifier 12 being arranged to charge condenser 15 through resistance 13. Condensers 14 and 15 discharge through resistances 16 and 17 respectively.

The operation of the circuit shown in Fig. 3 may be more readily understood by reference to Fig. 4 which shows the circuit voltages following a sudden change in the voltage across terminals 9 and 10. In Fig. 4, curve A represents a unit step voltage applied across terminals 9 and 10, terminal 9 being made negative with respect to terminal 10. This voltage corresponds to the circuit change which is desired to build up voltage across terminals 7 and 8 at a fast rate. Curves B and C, Fig. 4, correspond to the voltage across condensers 14 and 15 respectively. Curve D represents the total voltage across these condensers and therefore the output voltage across terminals 7 and 8. For a short period of time following the sudden voltage application of curve A, condensers 14 and 15 are charged through the series circuit including rectifier 11, the time constant of charge corresponding to the space path resistance of rectifier 11, the impedance of the source producing voltage at terminals 9 and 10 and the effective series capacitance of condensers 14 and 15. This charging action is shown in the curve of Fig. 4 between the points corresponding to zero time and time $a$. The voltages appearing across condensers 14 and 15 are in the inverse ratio of their capacitances as shown in curves B and C, giving a total voltage, curve D, which is a typical exponential voltage rise. After time $a$, condenser 14 is fully charged, and condenser 15 charges through the circuit comprising resistance 13 and rectifier 12, the time constant of this charge corresponding with the values of the space path resistance of rectifier 12, the value of resistance 13, and the capacity of condenser 15. This charging is shown in curve C, Fig. 4. At the same time, condenser 14 discharges through resistance 16 so that the voltage across this condenser decreases as shown in curve B, Fig. 4. By making the time constant of charge of condenser 15 correspond with the time constant of discharge of condenser 14, the rate of voltage decrease of curve B is caused to correspond with the rate of voltage increase of curve C, thereby maintaining substantially constant the total voltage across condensers 14 and 15. This condition is shown in curve D, Fig. 4.

In order that rectifier 12 shall not act as a short circuit around rectifier 11 and condenser 14, it is necessary that some resistance exist in the path of rectifier 12. This resistance may, for example, consist of the inherent resistance of rectifier 12. To provide a greater degree of isolation of rectifier 11 from operation of rectifier 12, it is desirable to supplement this internal resistance of rectifier 12 by an auxiliary resistance 13. This further isolates rectifier 11 from the effects of operation of rectifier 12 and provides maximum independence in the voltage build-up across condensers 14 and 15.

Fig. 5 shows the performance of the circuit of Fig. 3 when the source voltage tending to charge condensers 14 and 15 is suddenly removed. In the figure, curve A represents the applied voltage causing terminal 9 to be negative with respect to terminal 10 which is suddenly removed, and curve B represents the voltage across capacitors 14 and 15. Inasmuch as capacitor 14 discharges through resistance 16 practically to zero voltage a short time after the voltage is applied across terminals 9 and 10, curve B actually represents only the voltage appearing across condenser 15. The time constant of curve B of Fig. 5 corresponds to the discharge of condenser 15 through resistance 17 since it is this current flow that results in decrease in voltage across terminals 7 and 8.

In the circuit of Fig. 3 it is possible independently to establish the rate at which voltage build up follows the sudden change in applied voltage across terminals 9 and 10 and the rate of voltage decay after this voltage is suddenly discontinued. The former rate is established by the time constant of the circuit including rectifier 11, capacitor 14, and capacitor 15, and by using a small value of capacitor 14 may be made extremely small. The time constant of discharge is determined by the circuit comprising condenser 15 and resistance 17 and may be made long by choosing large values of these components. The circuit will operate to maintain substantially constant voltage across terminals 7 and 8 after a sudden increase in voltage across terminals 9 and 10 when the time constant of discharge of condenser 14 through resistance 16 corresponds to the time constant of charge of condenser 15 through resistance 13 and rectifier 12.

In one embodiment of the circuit shown in Fig. 3 adapted for use in a peak-limiting circuit to be described in further detail hereafter, it is desirable to increase the voltage across terminals 7 and 8 in a time that is small compared to one cycle of a 5000 cycle signal and to decrease the voltage across these terminals at a time constant corresponding to approximately one second. The following circuit values have been found to provide this performance:

Internal resistance of the source connected to terminals 9 and 10=1000 ohms
$R_{13}$=49,000 ohms
$C_{15}$=0.1 microfarad
$C_{14}$=0.005 microfarad
$R_{16}$=1 megohm
$R_{17}$=10 megohms When constructed in this manner, the voltage across terminals 7 and 8 increases with a time constant corresponding to 5 microseconds when a sudden charging voltage is applied across terminals 9 and 10. This corresponds to $^1/_{40}$ of a cycle of a 5,000 cycle wave. Discharge of condenser 15 is at a time constant of one second and, of course, can be made more rapid by choosing a smaller value of resistance 17. Inasmuch as the circuit constants listed above can be readily obtained in actual circuits, the device can be easily constructed with standard components.

In the event extremely fast charging action is desired with very slow discharging action, additional rectifier-condenser combinations may be added to the circuit of Fig. 3. By making each combination charge a condenser at the same rate another condenser discharges, the total voltage across the condenser group may be maintained constant so long as the applied voltage is continued. Eventually, only one large condenser remains charged and when applied voltage is removed, discharge will take place at a rate established by this condenser and its discharge resistor.

The performance of the circuit of Fig. 3 is in marked contrast to conventional fast-charging slow-discharging rectifier circuits. These circuits employ only a single rectifier that charges a condenser shunted by a resistor. The time constant of the charging action is determined by the equivalent resistance of the source of applied voltage and the rectifier, together with the capacitance of the condenser. The time constant of discharge is determined by the capacitance of the condenser and the value of the shunt resistor. Inasmuch as the resistance of the rectifier and the source of applied voltage are ordinarily quantities than cannot be controlled, fast charging can only be achieved by the use of a small capacitor. However, a small capacitor requires a very large value of shunt resistance to produce a large time constant of discharge, a resistance that may exceed the value due to leakage current flow in the circuit. Hence it is not possible independently to establish the rate of voltage build up and the rate of voltage decay in such circuits and a compromise must be made. Such compromise is not necessary in circuits constructed in accordance with the principles of this invention.

Fig. 6 shows the circuit diagram of a complete peak-limiting amplifier employing the principles of this invention. This amplifier includes two stages of amplification, each stage using a balanced circuit to isolate gain control currents from signal currents and voltages. Input signals are applied to terminals 18 and 19 and, after passing through adjustable attenuator 20, are impressed upon the primary winding of transformer 21. The two balanced voltages on the secondary winding of transformer 21 are applied through condensers 22 and 23 to the control electrodes of electron discharge devices 24 and 25 respectively. Resistance 26 shunts the secondary winding of transformer 21 and resistances 27 and 28 provide a ground return for the control electrodes of devices 24 and 25. The cathode of device 24 is grounded through resistance 29 and the parallel combination of resistance 30 and electron discharge device 31. Similarly, the cathode of device 25 is grounded through resistance 32 and the parallel combination of resistance 33 and electron discharge device 34. Resistances 35 and 36 are applied between the terminals of transformer 21 and the anodes of devices 24 and 25 to provide a shunting circuit around the amplifier including the devices in a manner similar to $Z_2$ in the circuit shown in Fig. 2. Output signals at the anodes of devices 24 and 25 are passed through condensers 37 and 38 to the control electrodes of electron discharge devices 39 and 40. Degenerative current feedback is supplied to these devices by resistances 41 and 42 respectively. Degenerative voltage feedback is supplied to device 39 by the combination of condenser 43, resistance 44, and resistance 45, while similar feedback is supplied to device 40 by condenser 46, resistance 47, and resistance 48. The anodes of devices 39 and 40 are connected to the primary of output transformer 49. Output signals from the secondary winding of transformer 49 are applied through attenuator 50 to output terminals 51 and 52.

In addition to the above described main channel amplifiers, a control voltage is taken across a tertiary winding on transformer 49 and applied to the cathodes of diode electron discharge devices 53 and 54. Resistance 55 isolates the cathode of device 54 from the cathode of device 53. Device 53 is arranged to charge condensers 56 and 57 in series whereas device 54 is arranged to charge only condenser 57. Resistors 58 and 59 discharge capacitors 56 and 57 respectively. Signals appearing at the anode of device 53 (point 60) are inserted into the main channel amplifier through the control electrodes of devices 31 and 34, thus to control the amplification thereof.

Power supply for the circuits of Fig. 6 is obtained from an alternating current source connected to terminals 61 and 62 which feed transformer 63. Rectifiers 64 and 65, together with condensers 66, 67 and 68, inductance 69, and resistance 70 provide unidirectional voltages at terminals 71 and 72 in the conventional manner. In addition, the circuit composed of resistance 73, gas discharge device 74 and potentiometer 75 provides an adjustable positive unidirectional voltage to the tertiary winding of transformer 49.

The peak-limiting amplifier shown in Fig. 6 is arranged so that devices 24 and 25 provide some gain under normal operation. That is, the zero bias impedance of devices 31 and 34 in combination with resistances 29, 30, 32 and 33 is of such value that conditions of Equation 3 are not met. However, resistances 29, 30, 32 and 33 are designed so that voltage gain is zero when devices 31 and 34 have infinite impedance by reason of cut-off bias appearing at point 60. Under normal operation, therefore, signals appearing at terminals 18 and 19 will appear at the control electrodes of devices 39 and 40 and as output voltage across terminals 51 and 52. There will be no conductance of diodes 53 and 54 in this condition for the delay bias supplied from potentiometer 75 will exceed peak signal level in the tertiary winding of transformer 49, thereby preventing the anodes of these devices from becoming positive with respect to the cathodes.

In the event that signal voltage at terminals 18 and 19 has such magnitude that the delay bias on devices 53 and 54 is exceeded, voltage appears at point 60, thereby biasing the grids of devices 31 and 34 accordingly. This voltage will be unidirectional by reason of the rectifying action of devices 53 and 54 and is of a direction to increase the impedance of devices 31 and 34. Inasmuch as increased impedance of these tubes decreases the gain of the amplifier stage including devices 24 and 25 a lower signal level relative to the signals at terminals 18 and 19 appears at devices 39 and 40 and the output voltage appearing across terminals 51 and 52 is less than the value that would otherwise exist, thus producing a volume limiting action for all signals exceeding a predetermined value.

The circuit comprising devices 53 and 54, together with resistances 58, 59 and 55 and capacitors 56 and 57 corresponds with the fast-charging slow-discharging circuit shown in Fig. 3. Hence, by choosing a small capacity 56 the voltage at point 60 may be made to increase very fast after a sudden signal voltage peak at terminals 18 and 19. Furthermore, this voltage may be maintained constant by causing the time constant of discharge of capacitor 56 through resistance 58 to correspond with the time constant of charge of capacitor 57 through resistance 59. In addition, restoration of gain in the amplifier stage comprising devices 24 and 25 may be made slow by providing a long time constant of discharge for capacitor 57 through resistance 59. Since the gain of the amplifier stage utilizing devices 24 and 25 is reduced to zero when tubes 31 and 34 are cut off, it is possible to handle extremely strong signals applied to terminals 18 and 19 without a substantial increase in output voltage across terminals 51 and 52.

The above described circuit is particularly useful in the audio frequency amplifier stages of a radio-telephone broadcasting system. Optimum performance of such systems requires that the amplitude of the sound frequency voltage be sufficient to modulate the transmitter to a high level. However, sudden peaks of audio frequency signal will then cause overmodulation of the transmitter with the attendant distortion and adjacent channel interference. The circuit of Fig. 6 avoids this difficulty for the audio signal peaks are suppressed relative to the normal audio frequency signals and accordingly are not passed on to overmodulate the transmitter.

While this invention has been shown and described as applied to a particular system of connections and as embodying various devices diagrammatically shown, it will be apparent to those skilled in the art that changes and modifications may be made without departing therefrom. The appended claims are therefore intended to cover all such changes and modifications as fall within the true spirit and scope of this invention.

What I claim as new and desire to secure by Letters Patent of the United States is:

1. In a variable-gain amplifying system, an electron discharge device having a cathode, a control electrode, and an anode, said device having an internal anode impedance $r_p$ and an amplification factor $u$, a source of input signals, an impedance $Z_3$, means connecting said impedance and said source in series between the cathode and control electrode of said device, said means connecting said impedance to said cathode, a source of anode operating voltage for said device, means connecting said last source in series with said impedance to supply voltage between said anode and cathode, a load circuit, means to cause said load circuit to respond to the anode space current of said first device, an auxiliary impedance $Z_2$, and means connecting said auxiliary impedance between said control electrode and said anode, one of said impedances being variable so that the relationship $$uZ_2=r_p+(1+u)Z_3$$

can be realized, thereby to reduce the voltage gain between said input source and load circuit to zero.

2. In an amplifier, an electron discharge device having a cathode, a control electrode, and an anode, said device having an internal anode impedance $r_p$ and an amplification factor $u$, a source of input signals, an impedance $Z_3$, means connecting said impedance and said source in series between the cathode and control electrode of said device, said means connecting said impedance to said cathode, a source of anode operating path voltage for said device, means connecting said last source in series with said impedance to supply voltage between said anode and cathode, a load circuit, means to cause said load circuit to respond to the anode space current of said first device, an auxiliary impedance $Z_2$, means connecting said auxiliary impedance between said control electrode and said anode, said first impedance being variable over a range including a particular value which substantially satisfies the relationship $$uZ_2=r_p+(1+u)Z_3$$

and for which said amplifier gain is zero.

3. In an amplifier, an electron discharge device having a cathode, a control electrode, and an anode, said device having an internal anode impedance $r_p$ and an amplification factor $u$, a source of input signals, an impedance $Z_3$, means connecting said impedance and said source in series between the cathode and control electrode of said device, said means connecting said impedance to said cathode, a source of anode operating voltage for said device, means connecting said last source in series with said impedance to supply voltage between said anode and cathode, a load circuit, means to impress signal voltage variations at the anode of discharge device upon said load circuit, an auxiliary impedance $Z_3$, means connecting said auxiliary impedance between said control electrode and said anode one of said impedances being variable over a range including a particular value for which the relationship $$uZ_2=r_p+(1+u)Z_3$$

is substantially satisfied and for which said amplifier gain is zero, and means for varying said one impedance as a function of said anode voltage variations, thereby to alter the gain of said amplifier automatically as a function of the signal level.

4. In an amplifier, an electron discharge device having a cathode, a control electrode, and an anode, said device having an internal anode impedance $r_p$ and an amplification factor $u$, a source of input signals, an impedance $Z_3$, means connecting said impedance and said source in series between the cathode and control electrode of said device, said impedance having a terminal connected to said cathode, a source of anode operating voltage for said device, means connecting said last source in series with said impedance to supply voltage between said anode and cathode, a load circuit, means to impress signal voltage variations at the anode of said discharge device upon said load circuit, an auxiliary impedance $Z_2$, means connecting said auxiliary impedance between said control electrode and said anode, one of said impedances being variable so that the relationship $$uZ_2=r_p+(1+u)Z_3$$

can be realized, thereby to reduce the voltage gain between said input source and load circuit to zero, and means to vary the value of said one impedance in accordance with the magnitude of signals impressed on said load circuit.

5. In an amplifier, an electron discharge device having a cathode, a control electrode, and an anode, a source of input signals, an impedance, means connecting said impedance and said source in series between the cathode and control electrode of said device, said impedance having a terminal connected to said cathode, a source of anode operating voltage for said device, means connecting said last source in series with said impedance to supply voltage between said anode and cathode, a load circuit, means to impress signal voltage variations at the anode of said discharge device upon said load circuit, an auxiliary impedance, means connecting said auxiliary impedance between said control electrode and said anode, and means to vary the value of said first impedance, said last means including an electron discharge device in parallel connection with said first impedance, and means to vary the impedance of said last device in accordance with the magnitude of signals impressed on said load circuit.

6. In an amplifier, an electron discharge device having a cathode, a control electrode, and an anode, said device having an internal anode impedance $r_p$ and an amplification factor $u$, a source of input signals, an impedance, means connecting said impedance $Z_3$ and said source in series between the cathode and control electrode of said device, said means connecting said impedance to said cathode, a source of anode operating voltage for said device, means connecting said last source in series with said impedance to supply voltage between said anode and cathode, a load circuit, means to impress signal voltage variations at the anode of said discharge device upon said load circuit, an auxiliary impedance, means connecting said auxiliary impedance between said control electrode and said anode, and means to vary the value of said first impedance, said last means including an electron discharge device in parallel connection with said first impedance, means for varying the internal anode impedance of said second device as a function of said voltage variations, said second discharge device and first impedance having a combined impedance $Z_3$ which is variable over a range such that the relationship $$uZ_2=r_p+(1+u)Z_3$$

is substantially fulfilled when space current flow in said second device is prevented.

7. In combination, a first condenser, means to discharge said first condenser, a second condenser, means to discharge said second condenser, means to charge said condensers in series relation, thereby to produce voltage thereacross, means further to charge said second condenser as said first condenser is discharged, said last means maintaining the total voltage across said condensers at a substantially constant value, thereby to cause electromotive force to build up across said condensers at a rate determined by their series capacitance and to decay in accordance with the characteristics of said means to discharge said second condenser.

8. In combination, a first condenser, and a second condenser, a source of electromotive force, means to charge said condensers in series relation in accordance with the voltage of said source, a resistance, means connecting said resistance in shunt with said first condenser, means to charge said second condenser in accordance with the voltage of said source, said last means having some internal resistance, the time constant of charge of said second condenser through said last means being substantially equal to the time constant of discharge of said first condenser through said resistance.

9. In combination, a first condenser, a second condenser, a source of electromotive force, means to charge said condensers in series relation in accord with the voltage of said source, said means including a rectifier, a resistance, means connecting said resistance in shunt with said first condenser, means to charge said second condenser in accord with the voltage of said source, said last means including a rectifier connected across said first condenser, and having some internal resistance, the time constant of charge of said second condenser through said last means being substantially equal to the time constant of discharge of said first condenser through said resistance.

10. In combination, a plurality of series connected units each comprising a capacitor and a shunt resistor, means to charge said units in accord with an electromotive force, means subsequently to charge all but one of said units in accord with said electromotive force, said last means having some internal resistance and a charging time constant substantially equal to the discharging time constant of said one unit.

11. In combination, an amplifier having an output circuit, means to produce unidirectional electromotive force of value determined by the relation of voltage in said output circuit to a predetermined value, a first condenser and a second condenser, means individually to discharge said condensers, means to charge said condensers in series relation in accord with the voltage of a said first means, means further to charge one of said condensers in accord with the voltage of said first means as said other condenser is discharged, said last means having a charging time constant substantially equal to the discharge time constant of the other of said condensers, and means to vary the gain of said amplifier in accord with the total voltage across said condensers.

12. In an amplifier having an electron discharge device with a cathode, control electrode, and an anode, a common cathode impedance, an impedance connecting said control electrode and said anode, and an output circuit, means to produce unidirectional electromotive force of value determined by the excess of voltage in said output circuit over a predetermined value, a first condenser and a second condenser, means individually to discharge said condensers, means to charge said condensers in series relation in accord with the voltage of a said first means, means further to charge one of said condensers in accord with the voltage of said first means as said other condenser is discharged, said last means having a charging time constant substantially equal to the discharge time constant of the other of said condensers, and means to vary the value of said cathode impedance in accord with the total voltage across said condensers, said variation being of direction to reduce the gain of said amplifier as the value of said output voltage increases.

13. A gain-controlled wave amplifying system comprising, in combination, a controlled amplifying device having control grid and anode circuits, means for impressing signal frequency waves to be amplified on said grid circuit, a first impedance common to said circuits providing current degenerative feedback at signal frequencies, a second impedance connected between the anode and control grid of said device, a control discharge device having a control electrode and having an anode-cathode path in shunt to said first impedance, said devices and impedances being adjusted to provide a predetermined signal gain through said first device when said second device is conducting and substantially zero gain when said second device is cut off, and a gain control circuit responsive to signal voltages exceeding a predetermined level supplied from the anode circuit of said first device, said gain control circuit comprising a signal detecting network which provides an increasing unidirectional voltage for increasing signal voltages above said level, said network having a very short effective time constant as compared to the period of a signal frequency in the increasing direction and a very long effective time constant in the decreasing direction, and means for impressing said unidirectional voltage on said control electrode in a polarity to reduce the conductivity of said second device.

14. A gain-controlled wave amplifying system comprising, in combination, a controlled amplifying device having control grid and anode circuits, means for impressing signal frequency waves to be amplified on said grid circuit, a first impedance common to said circuits providing current degenerative feedback at signal frequencies, a second impedance connected between the anode and control grid of said device, a control discharge device having a control electrode and having an anode-cathode path in shunt to said first impedance, said devices and impedances being adjusted to provide a predetermined signal gain through said first device when said second device is conducting and substantially zero gain when said second device is cut off, and a gain control circuit responsive to signal voltages exceeding a predetermined level supplied from the anode circuit of said first device, said gain control circuit comprising a pair of series-connected condensers, both said condensers being initially charged in series in response to an increase in signal voltage above said level, and further comprising a time constant network in circuit with each condenser, said networks causing one of said condensers thereafter to continue to charge at a certain rate as the other discharges at substantially the same rate, and means for impressing the voltage across said condensers in series upon said control electrode in a sense tending to reduce the conductivity of said second device.

DONALD E. MAXWELL.

REFERENCES CITED

The following references are of record in the file of this patent:

UNITED STATES PATENTS

| Number | Name | Date |
|---|---|---|
| 2,069,809 | Armstrong | Feb. 9, 1937 |
| 2,259,860 | Rinia | Oct. 21, 1941 |
| 2,261,335 | Braden | Nov. 4, 1941 |
| 2,261,356 | Foster | Nov. 4, 1941 |
| 2,282,383 | Root | May 12, 1942 |
| 2,323,634 | Van Slooten | July 6, 1943 |
| 2,331,708 | Maynard | Oct. 12, 1943 |
| 2,335,612 | Reiskind | Nov. 30, 1943 |
| 2,369,066 | Maxwell | Feb. 6, 1945 |